United States Patent [19]
Thorp

[11] Patent Number: 5,257,285
[45] Date of Patent: Oct. 26, 1993

[54] TRANSIMPEDANCE PRE-AMPLIFIER AND A RECEIVER INCLUDING THE PRE-AMPLIFIER

[75] Inventor: Stuart C. Thorp, Aldeburgh, England

[73] Assignee: BT&D Technologies Limited, Suffolk, England

[21] Appl. No.: 382,638

[22] PCT Filed: Dec. 12, 1988

[86] PCT No.: PCT/GB88/01099
§ 371 Date: Aug. 8, 1989
§ 102(e) Date: Aug. 8, 1989

[87] PCT Pub. No.: WO89/05543
PCT Pub. Date: Jun. 15, 1989

[30] Foreign Application Priority Data
Dec. 10, 1987 [GB] United Kingdom .................. 8728853

[51] Int. Cl.⁵ .............................................. H04B 10/06
[52] U.S. Cl. ...................................... 375/11; 330/293; 330/306; 359/189; 375/75
[58] Field of Search ................. 330/290, 291, 293, 302, 330/303, 304, 306, 310; 333/28 R; 375/75, 11; 455/619

[56] References Cited

U.S. PATENT DOCUMENTS

| | | | |
|---|---|---|---|
| 3,036,224 | 5/1962 | Abraham | 330/293 |
| 3,356,959 | 12/1967 | Vilkomerson | 330/293 |
| 3,436,670 | 4/1969 | Solomon | 330/293 |
| 3,436,675 | 12/1966 | Lunau | 330/290 |
| 3,707,685 | 12/1972 | Geffe | 330/306 |
| 3,849,744 | 11/1974 | Furuya | 375/11 |
| 3,863,173 | 1/1975 | Scheib et al. | 330/293 |
| 3,899,743 | 8/1975 | Csicatka | 330/293 |
| 4,420,724 | 12/1983 | Owen | 330/290 |
| 4,694,504 | 9/1987 | Porter et al. | 359/185 |

OTHER PUBLICATIONS

*Electronics Letters*, vol. 19, No. 14, Nov. 24, 1983, O. Wada et al., "Monolithic PIN/Preamplifier Circuit Integrated, etc.", pp. 1031–1032.
*Electronics Letters*, vol. 20, No. 20, Sep. 27, 1984, Walker et al., "Ge APD/GaAs FET/OP-AMP transimpedance optical, etc.", pp. 808–809.
*1978 IEEE International Solid-State Circuits Conference*, Feb. 15, 1978, R. L. Van Tuyl, "a monolithic integrated 4-GHz amplifier", p. 72.
*IEEE Transactions on Communications*, Oct. 1976, J. L. Hullett, "A Feedback Receiver Amplifier for Optical Transmission Systems", pp. 1180–1185.
*GaAs I.C. Symposium 1988*, Hatta et al, "A GaAs IC set for full integration of 2.4 Gbit/s optical transmission systems", pp. 15–18.
*Proceedings of the IREE Aust.*, Sep. 1979, Hullett, "Optical Communications Receivers", pp. 127–136.
*IEEE Journal of Solid State Circuits*, vol. SC-21, No. 6, Dec. 1986 pp. 909–915.

Primary Examiner—Benedict V. Safourek
Attorney, Agent, or Firm—Nixon & Vanderhye

[57] ABSTRACT

A transimpedance pre-amplifier circuit is arranged to have a complex pole response resulting from the interaction of the open-loop pole with the pole associated with a circuit feedback. The pre-amplifier circuit includes a transistor with a load capacitor connected in the transistor output circuit to determine the open-loop pole. The feedback includes a resistive element. The first stage of the pre-amplifier comprising the transistor may be followed by one or more further amplifying stages. The feedback to the input of the first stage may be from the output of one of the further stages. A receiver incorporating the pre-amplifier circuit includes only post-amplifiers connected to receive the output of the pre-amplifier. The response of the pre-amplifier makes it unnecessary to include a dedicated passive filter in the receiver and the post-amplifiers can have smaller bandwidths than in conventional receivers. This makes the receiver particularly useful for use at high frequencies, for example, of the order of 1.6 GHz.

19 Claims, 6 Drawing Sheets

Fig.8a $[|^E[s_1]|] \cdot |f_1[s_1 J]|$

α = 0.675
b = 0.7
n = 4
c = 1.61

CASCADE

RAISED COSINE EQUALISER

Fig.8c $[|^E[s_1]|] \cdot |f_1[s\ J]|$

α = 0.45
b = 0.8
n = 4
c = 0.92

CASCADE

RAISED COSINE EQUALISER

TRANSIMPEDANCE PRE-AMPLIFIER AND A RECEIVER INCLUDING THE PRE-AMPLIFIER

The present invention relates to a transimpedance pre-amplifier circuit and to a receiver circuit incorporating the pre-amplifier circuit.

The circuits are particularly intended for receiving and amplifying digital signals at high frequencies. For example, the circuits can be used in optical transmission systems at frequencies above 1 GHz.

The traditional approach to receiver design involves the use of a front end whose idealised response shows a simple roll-off of amplitude with increasing frequency, which requires the following receiver stages to have very wide bandwidth. In order to avoid high frequency is instability, traditionally designed receivers incorporate a dedicated passive filter. Using discrete components, it is possible to fabricate suitable wide bandwidth circuits, but the concomitant disadvantages of large size and high cost conspire against the widespread adoption of such hybrid circuits in telecommunications systems.

In an ideal receiver for a digital transmission system, the object is to ensure that at the receiver decision point (where the nature of a received bit is determined) the spectrum is of raised cosine form. The effect of having a raised cosine spectrum is to ensure finite bit length such that during determination of a particular bit the immediately preceding bit contributes nothing. In traditional receiver design, a raised cosine response is not directly realisable, but reasonable approximations can be achieved. If the receiver pre-amplifier has a single pole response, as is usual, a close approximation to a raised cosine is obtained by combining this with a 3 pole maximally flat Butterworth filter. There are several significant disadvantages to this approach: first, if the pre-amplifier has a bandwidth of 0.6 times the system bit rate (B), and the Butterworth filter has a bandwidth of 0.7B, as is usual, the remaining amplifier stages need a bandwidth much greater than B in order for the receiver as a whole to satisfy the Nyquist requirement. The provision of suitable wide bandwidth amplifiers is expensive, technically demanding and leads to excessive power dissipation. In addition to such amplifiers being difficult to implement as integrated circuits, the Butterworth filter, which routinely comprises an inductor and a pair of capacitors, is also difficult to realise as part of an integrated circuit.

Unfortunately, in integrated circuit technology, a large bandwidth is generally only realisable at the cost of increased power dissipation, because parasitic capacitance, etc., become increasingly important as the feature size is reduced in order to achieve large bandwidth performance. As a result, high bit rate (2.4 GBit and above) receivers have thus far been produced with only very limited levels of integration ("low functionality").

An example of a "state-of-the-art" 2.4 Gb/s receiver is that described by Y. Hatta et al of Hitachi, at the recent IEEE GaAs IC Symposium 1988. The Hatta receiver comprises a set of seven GaAs chips, three of which are amplifiers. The three amplifier chips each has an output buffer with peaking capability to improve frequency response, although this wastes power. The transimpedance pre-amplifier has a bandwidth of 2.4 GHz, the two subsequent amplifier stages having bandwidths of 2.9 and 2.8 GHz respectively.

The present invention provides a pre-amplifier circuit which can be "tailored" in accordance with the overall requirements of the receiver to enable less stringent demands to be made on the component stages of the receiver circuit. This enables the invention to avoid high frequency instability and to meet the design criteria even at very high frequencies and even where the receiver is to be fabricated on integrated circuits.

According to a first aspect of the present invention there is provided a transimpedance pre-amplifier circuit comprising a first transistor amplifier stage having an input and an output, and feedback means coupling the output to the input, and further comprising a load including a reactive element connected to the output of said first stage to determine the open-loop pole of the circuit, wherein the relationship betweeen the parameters of the feedback means and of the load has been chosen to cause the open-loop pole and the pole associated with the feedback means to interact such that the pre-amplifier circuit has a predetermined complex pole pair response.

The invention also extends to a receiver circuit comprising a transimpedance pre-amplifier circuit of the invention, and at least one post-amplifier connected to receive the output of the pre-amplifier circuit.

The response of the pre-amplifier circuit can be tailored, by variation of its poles, to give the receiver incorporating the pre-amplifier required performance characteristics. In particular, these performance characteristics can include a required bandwidth in combination with a linear phase response or a maximally flat gain. Where a maximally flat gain is required, a good though not necessarily linear phase response may also be achieved.

Preferably, the load includes a capacitor having one terminal connected to the stage output whilst its other terminal is connected to a supply rail of the pre-amplifier circuit. The capacitor may be implemented as a voltage controlled capacitor (Varactor), in which case it is connected between the stage output and a controlling power supply rail.

Preferably, the feedback means comprises a resistive element. In the pre-amplifier circuit, one or more level shifting diodes may be connected in the forward sense in the feedback means.

Preferably, the first transistor amplifier stage of the pre-amplifier circuit has an additional transistor arranged in its load circuit in a cascode configuration to increase the gain of the stage. The transistor amplifier stage is preferably comprised of one or more field effect transistors.

A preferred embodiment of the pre-amplifier circuit comprises one or more further amplifying stages with one or more of these further stages being incorporated in the feedback means such that the output of one of the further stages is coupled to the input of said first transistor amplifier stage.

According to a further aspect of the present invention there is provided a receiver circuit comprising a pre-amplifier circuit having a circuit input, at least one transistor amplifier stage connected to said circuit input, feedback means coupled to said circuit input, a circuit output, and at least one post-amplifier stage connected to the circuit output of said pre-amplifier circuit, wherein the pre-amplifier circuit is arranged to have a complex pole pair response, and there is no dedicated passive filter in the receiver circuit.

Instead of including a dedicated passive filter, the receiver circuit as a whole performs as a filter. The omission of a dedicated passive filter makes the receiver easier to fabricate as an integrated circuit and if required, the receiver could be fabricated on a single chip.

The response of the pre-amplifier is dominant in determining that the receiver has a good pulse response and relatively good gain and phase responses. Furthermore, the receiver has an overall lower power requirement than comparable traditional receiver circuits.

Embodiments of the present invention will hereinafter be described, by way of example, with reference to the accompanying drawings, in which.

In the drawings, the same reference numerals are used to refer to the same or similar components.

The present invention is concerned with the design of receiver circuits to be fabricated as integrated circuits in any appropriate technology. Currently, fabrication of the receiver circuits on a gallium arsenide chip 14 is preferred because the receivers are intended for use in extremely high frequency environments, for example, such as optical transmission systems.

It is desirable to produce a receiver circuit fabricated by one or more integrated circuit chips which has a high gain and a well-defined bandwidth at the frequencies of interest. The bandwidth should have a well-defined cut-off so that it is restricted in width. If the bandwidth is too wide, this over provision not only increases the power requirement, but also increases the noise transmitted by the receiver. In addition, in optical communications it is generally desirable that the receiver have a linear phase response, that is, a constant delay with frequency, so that it does not introduce pulse distortion.

Figure 1:
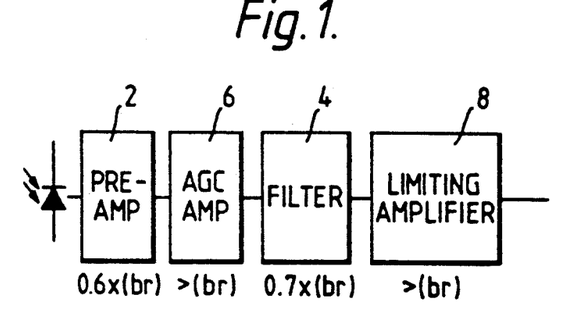
FIG. 1 shows a block diagram of a receiver circuit designed in known manner to meet predetermined criteria.

The traditional approach to receiver design is illustrated by the circuit of FIG. 1. This approach provides a series connection of a number of individual circuits, where each circuit is generally chosen to fulfill one of the predetermined criteria. Thus for maximum sensitivity, a pre-amplifier 2 is provided which has a well-defined bandwidth at the frequency of interest and which has a good pulse response. Where the receiver is to be used with a digital transmission system, such as an optical transmission system, it is known that the receiver should have an overall bandwidth of the order of $0.5 \times$ the bit rate B. In this case, a pre-amplifier 2, having a transfer function with a dominant pole at $0.6 \times B$ (the bit rate) would normally be expected to give a good response.

The well-defined cut-off to the bandwidth of the overall receiver is traditionally provided by way of a dedicated passive filter 4. This filter would preferably have a maximally flat filter function and a bandwidth of the order of $0.7 \times B$. In known manner, the required gain of the circuit is provided by one or more post-amplifiers such as an automatic gain control amplifier 6 and a limiting amplifier 8. The automatic gain control amplifier 6 enables the gain of the overall receiver circuit to be varied if required, and the limiting amplifier 8 is arranged to produce output signals of the correct level to interface with following circuits, such as logic circuits and the like.

The approach illustrated in FIG. 1 has practical problems, particularly when working at frequencies in excess of 1 GHz. Firstly, the overall transfer function of the receiver is the product of the transfer functions of all of the elements thereof. It will therefore be appreciated that in seeking to obtain a required overall bandwidth of the order of $0.5 \times$ the bit rate, the circuit of FIG. 1 requires that the amplifiers 6 and 8 each have a bandwidth in excess of the bit rate. At frequencies as high as 1.6 GHz the practical amplifiers required by the circuit of FIG. 1 can be difficult to implement. They require very large bandwidths, as well as high gain, and therefore have high power consumption, which can provide difficulties on integrated circuits. There is also the risk of instability at the frequencies of interest.

There can also be problems in implementing filter circuits on chip, particularly at the frequencies of interest. Where the circuit is to be made on Gallium Arsenide, it may even be that a filter with the bandwidth of interest cannot be implemented on chip.

It will therefore be appreciated that the receiver illustrated in FIG. 1 requires as its building blocks, circuit elements which, at the particular frequencies of interest, will be pushed to their performance limits.

Figure 2:
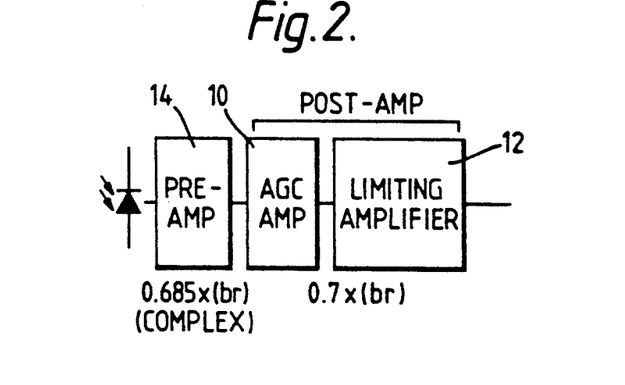
FIG. 2 shows a block diagram of a receiver circuit of the present invention.

The present invention proposes a fresh approach, illustrated in FIG. 2, to the design of receiver circuits which does not have the problems discussed above. In the receiver of FIG. 2, the post-amplifiers, namely an automatic gain control amplifier 10 and a limiting amplifier 12, are only required to have a bandwidth of $0.7 \times$ the bit rate. Where the bit rate is 1.6 GBits per second, the bandwidth of the amplifiers 10 and 12 of FIG. 2 is only required to be 1.12 GHz as compared to the bandwidth of 1.6 GHz required by both the post-amplifiers 6 and 8 in the arrangement of FIG. 1. The reduction in the bandwidth required by the amplifiers 10 and 12 in a receiver circuit of the invention is achieved by omitting the dedicated passive filter and by providing a pre-amplifier 14 which is arranged to enable the overall receiver to meet the predetermined criteria.

The pre-amplifier 14 is designed to be able to tailor the overall response of the receiver to give the required bandwidth and a linear phase characteristic. The novel pre-amplifier which is able to so dominate the overall response of the receiver circuit is a transimpedance pre-amplifier circuit with feedback having a transfer function with a complex pole pair response. The bandwidth of the open loop response of the pre-amplifier is adjusted such that it interacts with the pole associated with the feedback to provide the complex pole pair response.

Figure 3:
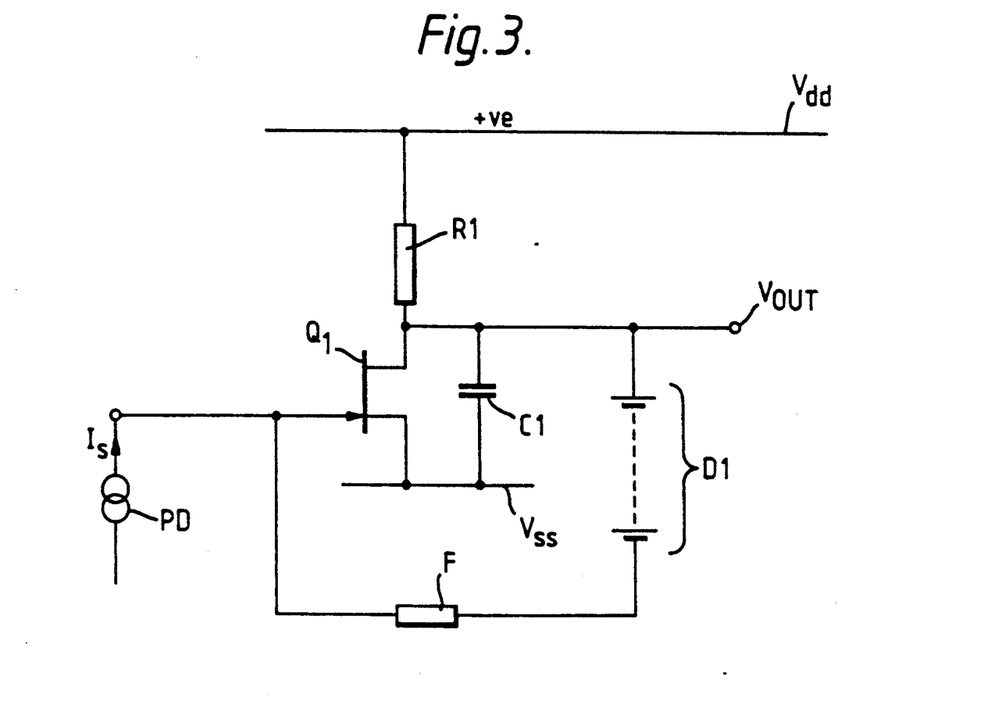
FIG. 3 shows a basic transimpedance pre-amplifier circuit of the invention.

FIG. 3 shows one example of a basic implementation of a transimpedance pre-amplifier circuit of the invention.

The pre-amplifier illustrated in FIG. 3 receives its input from a photodiode or other photodetector arranged to produce a photocurrent when illuminated. In FIG. 3, the photodetector is represented as a constant current source PD.

The photocurrent emitted by the photodetector PD is applied to the input of the pre-amplifier, the input being the gate of an n-channel field effect transistor (FET) Q1. The drain of the FET Q1 is connected to the positive supply Vdd by way of a load resistor R1. The source of the FET Q1 is connected to the negative supply Vss. A load capacitor C1 is connected between signal ground the supply Vss (i.e., or $V_{dd}$) and the drain of the FET Q1.

The output of the pre-amplifier stage, taken from the drain of the transistor Q1, is fed back to the input by feedback means represented by a feedback element F. Generally the feedback element F is constructed as a resistor but it will have an associated parasitic capacitance. It will be seen that the output of the pre-amplifier stage is applied to the feedback means by way of a level shifting network D1 which, in the illustrated embodiment, comprises an idealised voltage source. The values of the resistance of the feedback element F and of the capacitance of the load capacitor C1 are chosen to give the required bandwidth and a linear phase characteristic.

It will be appreciated that the pre-amplifier stage of FIG. 3 has an inverted output.

Figure 3A:
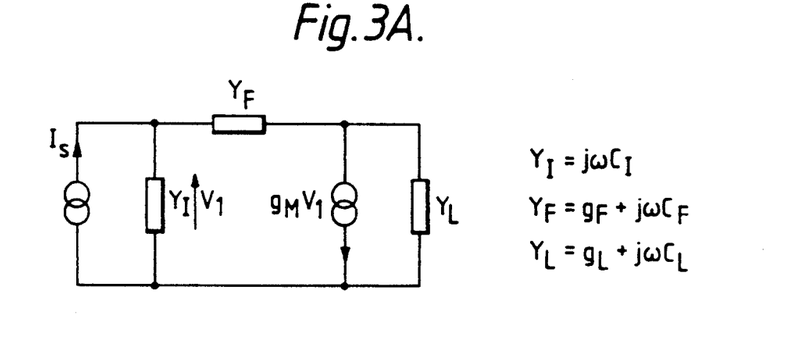
FIG. 3a shows the small signal model of the circuit of FIG. 3.

FIG. 3A shows a small signal model for the pre-amplifier circit of FIG. 3 in which the output of the FET Q1 is represented as a constant current source, the current of which is determined by the transconductance $g_M$ of the transistor.

In the model, and in the equations given below, the following terms are used:

$g_L$ Total load conductance (including the output conductance of the FET Q1)

$C_L$ Total load capacitance (including the output capacitance of the FET Q1)

$Y_L$ Load admittance, $Y_L = g_L + jwC_L$, where w is the angular frequency $g_F$ Feedback conductance $C_F$ Parasitic feedback capacitance $Y_F$ Feedback admittance, $Y_F + g_F + jwC_F$ $C_I$ Input capacitance (including the input capacitance of the FET Q1, of the photodiode PD and additional parasitics)

$g_M$ Transconductance of FET Q1

$A_{OL}$ Open loop gain, $A_{OL} = g_M/g_L$ $Y_I$ Input admittance, $Y_I = jwC_I$ $I_s$ Signal current from photodiode PD $V_{OUT}$ Output voltage from pre-amplifier circuit The open-loop bandwidth $B_{OL}$ of the circuit (the response without feedback) is given by:

$$B_{OL} = \frac{g_L}{2\pi C_L} \quad [1]$$

If, classically, the open-loop bandwidth $B_{OL}$ is assumed to have infinite frequency, modelled as a zero capacitance load on the open loop amplifier, the closed loop bandwidth $BC_L$ is given by:

$$B_{CL} = \frac{g_F}{2\pi(C_F + C_I/(A_{OL} + 1))} \quad [2]$$

It will be appreciated from equation [1] that the open-loop bandwidth may be varied by varying the value of the load capacitance $C_L$. In practice, for a particular transistor, the open-loop bandwidth is determined by the capacitance of the load capacitor C1.

Clearly, the closed loop bandwidth $B_{CL}$ (the pole associated with the feedback) is determined by the open loop gain, by the parameters of the FET Q1, specifically by its transconductance $g_M$, and by the parameters of the feedback element F. Thus, for a particular transistor, and a particular open loop gain, the closed loop bandwidth is determined by the resistance (i.e., conductance $g_F$) and parasitic capacitance $C_F$ of the feedback element F.

The open-loop bandwidth and closed loop bandwidth of the pre-amplifier circuit of FIG. 3 are arranged to interact to produce a transfer function for the circuit which has a complex pole pair response. This transfer function can be expressed as:

$$\frac{V_{OUT}}{I_s} = \frac{(Y_F - g_M)}{(Y_L + Y_F)(Y_I + Y_F) - Y_F(Y_F - g_M)} \quad [3]$$

The response of the pre-amplifier circuit is a complex pole pair response which can be thought of as resulting from the interaction of the open-loop pole with a pole associated with the feedback. The bandwidth of the circuit of FIG. 3 is defined as the frequency at which the transfer function [3] is reduced by a factor $\sqrt{2}$ from its mid-band value. This is a complicated function which is best evaluated numerically, or simulated using a circuit simulator such as ASTEC 3 or SPICE.

The interaction of the open-loop pole with the pole associated with the feedback may be varied to give the required bandwidth and to ensure a linear phase characteristic. It has also been found that this circuit has a shorter delay and a lower power consumption than a conventional pre-amplifier stage incorporating a filter circuit to ensure linear phase response.

The circuit of FIG. 3 has the considerable advantage that as its response can be easily varied; by varying the value of the feedback element F and/or of the load capacitor C1, and/or the open loop gain $A_{OL}$; it can be "tailored" to match the limitations of the overall receiver. This places much less stringent demands on the circuit design and on individual circuit components. In addition, and as discussed above with reference to FIGS. 1 and 2, this also enables less stringent demands to be made on other stages of the overall receiver.

It has been found that the complex pole pre-amplifier circuit of FIG. 3 generally has an under-damped response. In one example, the circuit had a damping factor of the order of 0.80, this giving the required phase response.

Figure 4:
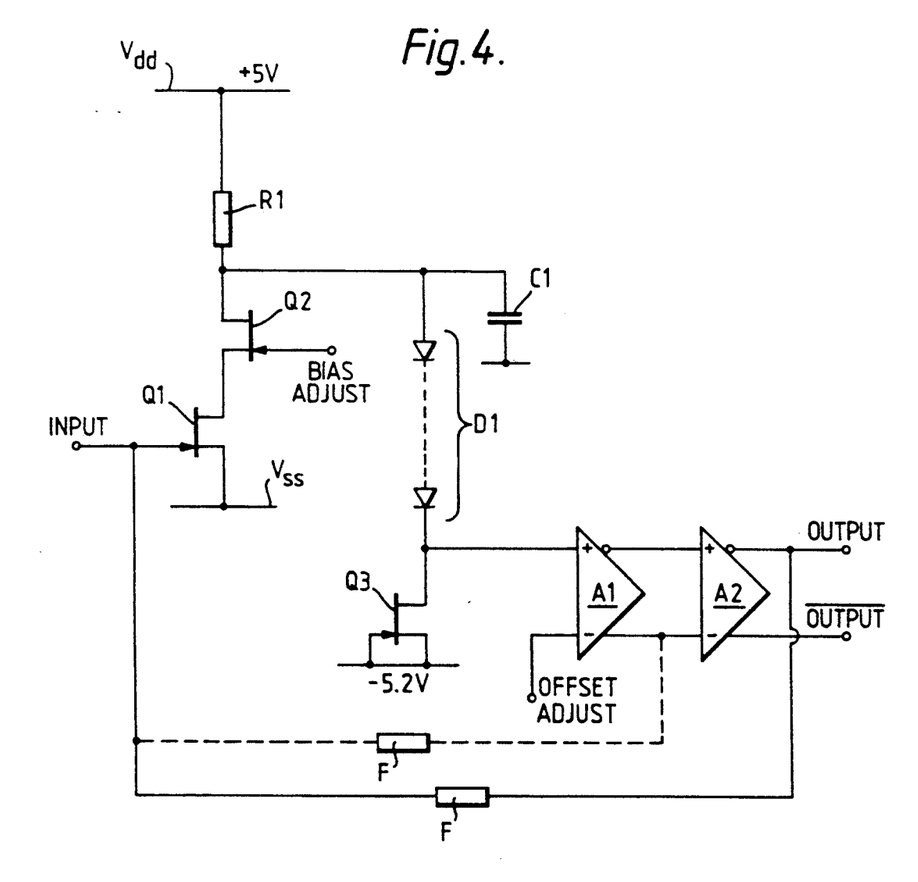
FIG. 4 shows an alternative embodiment of a transimpedance pre-amplifier circuit of the invention including more than one amplifying stage.

FIG. 4 shows one embodiment of a multi-stage pre-amplifier circuit having a complex pole pair response.

In the first stage of the pre-amplifier circuit of FIG. 4, the signal current from the photodiode (not shown) is input to the gate of the FET Q1. However, in this embodiment, to provide more gain, a further FET Q2 is interposed e.g., to reduce Miller effect input capacitance, in cascode configuration, in the drain path of the amplifier transistor Q1. A suitable bias voltage is applied to the gate of FET Q2 to keep it in saturation. This bias voltage may be adjusted to control the open loop gain $A_{OL}$.

The output circuit of the cascode connected amplifier transistors Q1 and Q2 includes the load resistor R1 as previously.

The load capacitor C1 is connected between the output of transistor Q2 and the signal ground. It will be appreciated that the value of the capacitance C1 can be used to control the open-loop bandwidth of the pre-amplifier circuit.

The output of cascode configuration, taken at the drain of FET Q2 is fed to the input of a series of further amplifying stages A1, A2, by way of level shifting means D1 implemented as a series of diodes D1 coupled to a negative level determining voltage by way of an active load FET Q3.

In the implementation of the pre-amplifier circuit shown in FIG. 4, the feedback is taken out not from the output of the first stage to its input, but from the output of the third stage, that is, the second further stage A2. An alternative feedback path from the output of the second stage A1 is also illustrated by a dotted line.

The number of further amplifying stages A1, A2 etc. provided is chosen as required. In a preferred embodiment, all of the further amplifier stages A1, A2 etc are identical and are isolated from each other. Each further stage may be an appropriate differential amplifier. The feedback element F should be applied around an inverting open loop amplifier.

As described with reference to FIGS. 1 and 2, a pre-amplifier circuit as shown in FIG. 4 has a dominant role in determining the overall response of a receiver circuit having a structure as illustrated in FIG. 2.

Tests were performed on a simulation of a receiver as shown in FIG. 2 incorporating a pre-amplifier circuit arranged to have a complex pole pair response and the responses were compared with the simulation of a receiver as shown in FIG. 1. The results of these tests are given below.

The tests were made for operation at 1.6 GBits/sec.

The receiver of FIG. 1 was simulated to comprise a pre-amplifier stage 2 with a single pole at 0.6×(bit-rate B) GHz, a two-pole Butterworth filter 4 set for −3 dB at 0.7×B GHz, an amplifier 6 with a single pole response at B GHz and a limiting amplifier 8 again with a bandwidth at B GHz. In the simulation, the amplifiers 6 and 8 were combined and modelled as a six-stage post-amplifier with a −3 dB frequency of 1.6 GHz. Each amplifier stage was modelled as a cascade of an amplifying and a buffer stage, each having the same pole frequency. Thus the post-amplifier is assumed to be a cascade of twelve idealised stages with real poles at 6.56 GHz.

The receiver of FIG. 2 was simulated to comprise a pre-amplifier 14 with a complex pole response giving −3 dB at 0.685×B GHz and a damping factor of 0.80. Again, the amplifier stages 10 and 12 were combined and modelled as a six-stage post-amplifier with a bandwidth of 0.7×B GHz. Thus the post-amplifier is assumed to be a cascade of twelve idealised stages with real poles at 4.59 GHz.

The individual bandwidths for each stage of the two receivers of FIGS. 1 and 2, and their overall bandwidths, are summarised in Table 1.

TABLE 1

COMPARISON OF BANDWIDTHS

TABLE 1-continued

| | Pre-amplifier Filter | | | Post-amplifier | Overall Receiver |
|---|---|---|---|---|---|
| | f(−3dB) GHz | Damping factor | f(−3dB) GHz | f(−3dB) GHz | f(−3dB) GHz |
| Figure 1 | 0.960 | >1 | 1.12 | 1.60 | 0.738 |
| Figure 2 | 1.10 | 0.80 | — | 1.12 | 0.799 |

It will be seen that despite the lower bandwidth in its post-amplifier stages 10 and 12, the receiver of FIG. 2 has the highest overall bandwidth. In fact, the receiver of FIG. 1 does not attain the Nyquist sampling rate of 0.8 GHz overall bandwidth for 1.6 GBit/s transmission.

Figure 5:
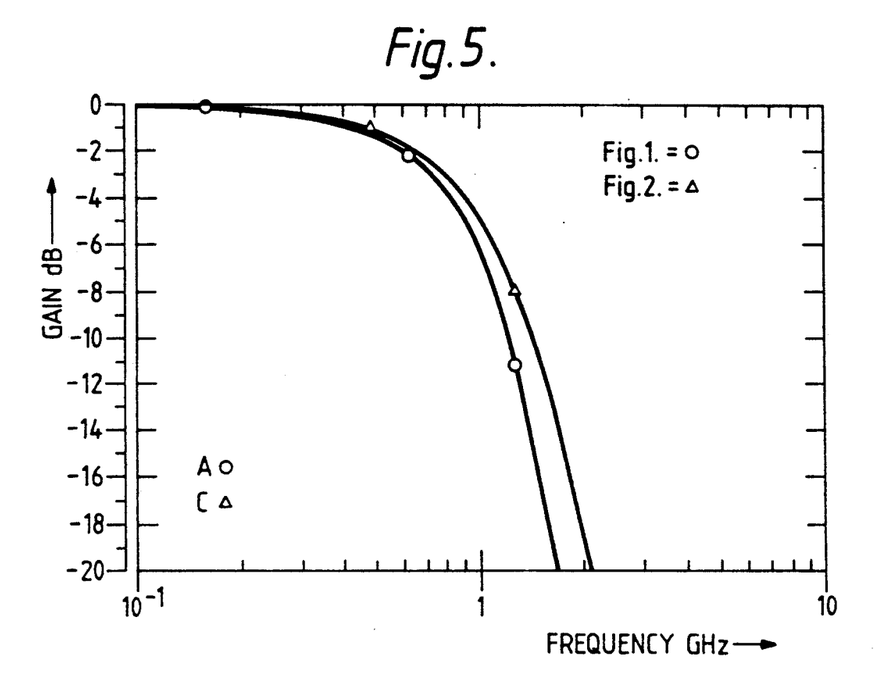
FIG. 5 shows the normalised gain response of the receiver of FIG. 1 and of the receiver of FIG. 2.

FIG. 5 shows the normalised gain responses for the two receivers and it will be seen that the circuit of FIG. 2 does have the sharp roll-off required for a well-defined bandwidth.

Figure 6:
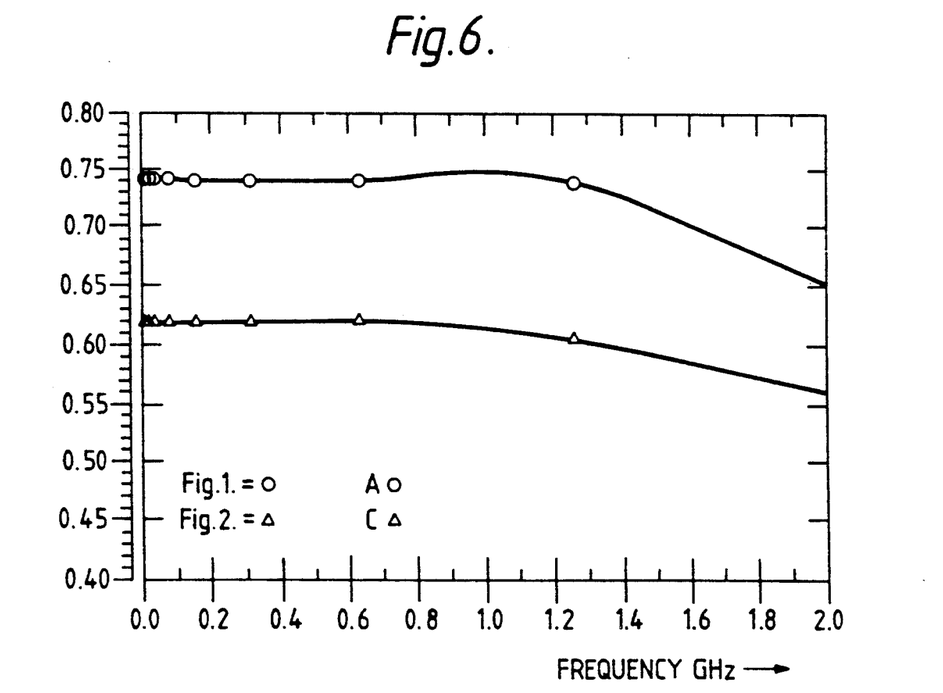
FIG. 6 illustrates the group delay response of the receivers of FIGS. 1 and 2.

The group delay characteristics of the two receivers are set out in Table 2 and illustrated in FIG. 6.

TABLE 2

| RECEIVER DELAY RESPONSES | | |
|---|---|---|
| | Delay at DC (ns) | Deviation up to 1.2 GHz (ns) |
| Figure 1 | 0.74 | 0.01 |
| Figure 2 | 0.62 | 0.01 |

It will be seen that the receiver of FIG. 1 has the highest delay at DC, but a small overall delay deviation. The receiver of FIG. 2 has a lower delay than that of FIG. 1, and an equally good delay deviation.

Figure 7:
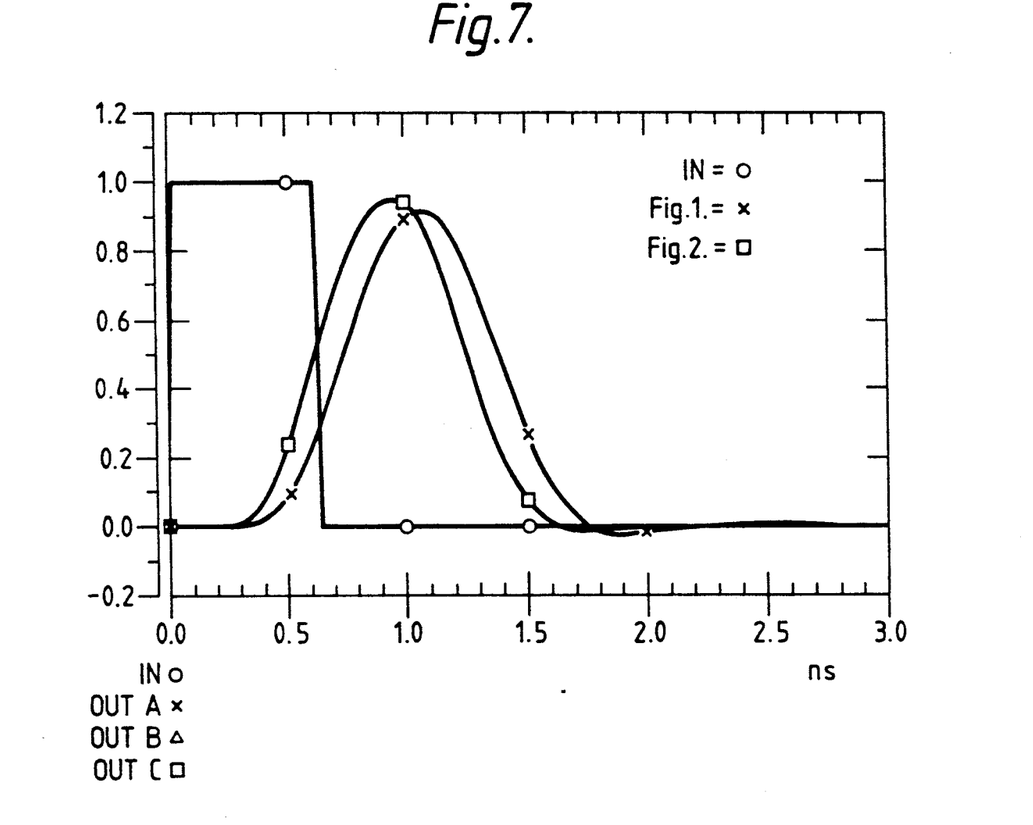
FIG. 7 shows a normalised pulse response for receivers as illustrated in FIGS. 1 and 2.

The two receivers were given simulated stimulation with an input pulse of width 0.625 ns and rise and fall times of 10 ps. This represents an 'ideal' non-return to zero (NRZ) pulse at 1.6 GBit/s. The simulated output responses are presented in FIG. 7. The delay times broadly correspond to those predicted from the small-signal simulation.

The receiver of FIG. 1 has a symmetrical output pulse, with slight overshoot on the falling edge. That of FIG. 2 has the largest output pulse magnitude, no doubt a consequence of the higher bandwidth of this circuit. It has a reasonably symmetrical output pulse, with minimal overshoot on the falling edge.

The power consumption for the receivers of FIGS. 1 and 2 was estimated. To do this the following assumptions were made:

The power supplies to each receiver are ±5 V;

The pre-amplifier stage for each receiver includes a 300 μm FET (as Q1) biased with a source to drain current of 8 mA;

Each receiver drives an ECL compatible output buffer which consumes 88 mW;

The 1.6 GHz post amplifier (6,8) of the receiver of FIG. 1 has a power consumption of 240 mw per stage; and The 1.16 GHz post-amplifier (10,12) of the receiver of FIG. 2 has a power consumption of 96 mW per stage.

With these assumptions, the estimated power consumption is set out in Table 3:

TABLE 3

| ESTIMATED POWER CONSUMPTION | | | | |
|---|---|---|---|---|
| | 1st stage [mW] | post-amplifier [mW] | output buffers [mW] | total [mW] |
| Figure 1 | 40 | 1440 | 176 | 1656 |
| Figure 2 | 40 | 576 | 176 | 792 |

Thus the receiver of FIG. 2 is estimated to have less than half the power consumption of that of FIG. 1.

It is possible to conclude that, as would be expected, the receiver of FIG. 1 constructed using a traditional approach, gives a well behaved response, with a sharp gain roll-off and good phase linearity. Its pulse response is also symmetrical.

However, great demands are placed on the post-amplifier stages (6,8) which are required to have close to ideal responses. Because these stages have large bandwidths they consequently consume high power and are liable to instability.

The tests show that a pre-amplifier with a complex pole pair response can give the receiver in which it is incorporated, for example, as that of FIG. 2, an overall linear phase response. This receiver has all of the benefits obtained by the traditional approach, that is, a sharp roll-off in gain, a good pulse response, and a linear phase response. Indeed, the overall delay of the receiver is less. In addition, as the response of the pre-amplifier is tailored to match the limitations of the overall receiver, much less stringent demands are placed on the design of the circuit, and a considerable power saving can be made (48°/o of the consumption of the receiver of FIG. 1). A further benefit is that the likelihood of instability is reduced, since the component parts of the receiver operate with a lower bandwidth. The receiver of FIG. 2 should also have a sensitivity advantage over that of FIG. 1 since the pre-amplifier has an underdamped response and, for a particular bandwidth, will have a larger feedback resistance than the over-damped case. Hence the noise contribution due to the resistor is reduced, albeit by a small amount.

Figure 8A:
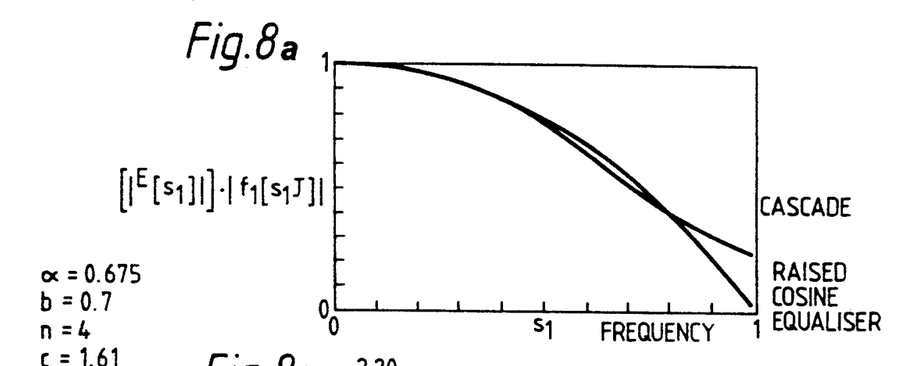
FIGS. 8a-8d show the spectral response and the eye diagrams for 2 embodiments of the present invention.
Figure 8B:
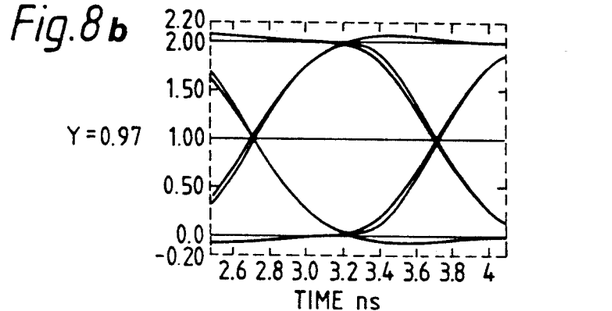
Figure 8C:
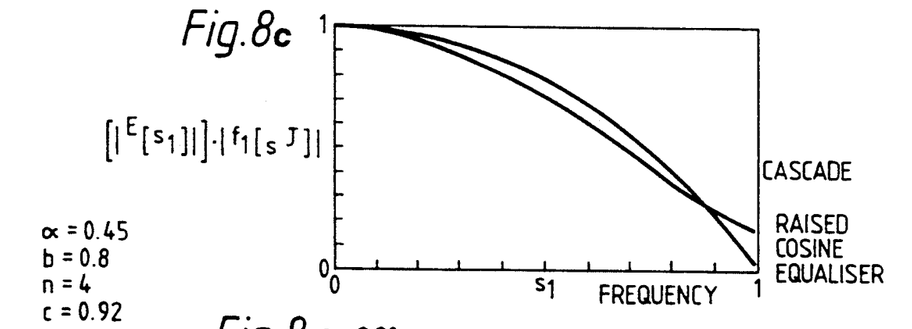
Figure 8D:
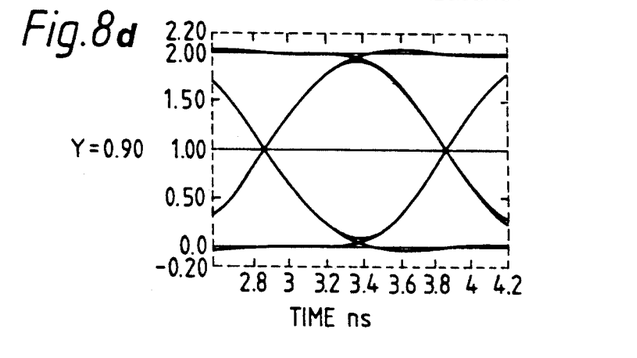

The following example shows how a raised cosine frequency response may be emulated by arranging a pre-amplifier having a second order response to be cascaded with an amplifier chain having a plurality of (in this case 4) equal single pole responses. Significantly, with our approach there is only a small penalty P (of less than 1 dB) compared to the 'ideal' raised cosine approach. The damping factor and pre-amplifier bandwidth can be tailored to adjust the overall amplitude and frequency responses.

$$f(s) = \left[\frac{b^2}{s^2 + 2abs + b^2}\right] \times \left[\frac{c}{s+c}\right]^n$$

where
2a = damping factor
b = bandwidth factor of the pre-amp
c = bandwidth factor of the single poles
n = number of single poles
s = complex frequency normalized to bit rate There are two optimisations of particular interest:
the first, to minimise b, the pre-amplifier pole, for minimum noise; and
the second, to minimise c, the bandwidth factor of the cascaded poles, for minimum power consumption, FIGS. 8a and 8c shows the spectral responses FIGS. 8b and 8d the respectively corresponding eye diagrams for an example of each approach.

For a damping factor of 0.675, pre-amplifier bandwidth factor, b, of 0.7 and a cascade of four poles with overall bandwidth factor of 0.7 (c=1.61), the spectral response and eye opening are very similar to those for the raised cosine case (the case in which the spectrum at the receiver decision point, where the decision is made whether the received bit is a zero or one, is a raised cosine spectrum according to $f(s) = \frac{1}{2}[1 + \cos(\pi s)])$ while the noise integrals are well controlled.

For a damping factor of 0.45, pre-amplifier bandwidth factor, b, of 0.8 and a cascade of 4 poles with overall bandwidth factor of 0.4 (c=0.92), the spectral response, delay flatness, eye opening and noise integrals are very similar to those for the combination of a pre-amplifier having a single pole response followed by a 3 pole maximally flat Butterworth filter, which combination is itself a reasonable approximation of a raised cosine response.

The bandwidth and damping factor can be controlled by choice of feedback resistor and capacitance across the load resistor provided all other parameters are constant. For a particular 400 Mbit receiver, and the two optimisations discussed above, the performance, including penalty at 400 Mbit/s, is

| Optimised to minimize | Feedback Resistance Kohms | Bandwidth of subsequent amplifiers c | Power Penalty P(dB) |
|---|---|---|---|
| noise | 34.5 | 1.61 | 0.17 |
| power consumption | 19 | 0.92 | 0.47 |

Both cases look attractive for a number of reasons:

The penalty is acceptable and might be reduced by further optimisation.

There is no requirement for a separate filter which would force chip partitioning.

Off-chip inductors are not required.

The response of the cascade of single order stages can be approximated by introducing one single pole response if the same chips are used at lower bit rates.

The second case has the additional advantages that:

The bandwidth requirement of amplifier stages has been minimised; allowing either lower power consumption or higher speed operation from a given process.

The jitter is better controlled.

Consideration must be given to the process dependence of the pre-amplifier design for fixed bit rates and to the tractability of setting on test for multi-bit rate solutions. This has been done for the second case which was considered above. In order to address the problem simply the dependence of damping factor, a, and bandwidth factor, b, on a ±20°/o tolerance on Rf, RL, gm and Ct have been investigated carefully. Cf has a small effect and CL is assumed to be either controllable or process independent. RL and Rf are assumed to track approximately. The subsequent cascaded poles are kept fixed.

The following 3 combinations of damping factor and bandwidth factor are considered to represent the worst results from the tolerancing of component values. They have been investigated further. The receiver performance has been calculated to include the effects of modified component values as well as noise integrals. The penalty P1, as in previous examples, is quoted relative to the following receiver example with raised cosine equalisation and unchanged component values (Rf=25 KΩ at 400 Mbit/s).

A ±5 V receiver, using saturated loads, designed on a standard 0.5 μm gallium arsenide depletion mode process.

| The relevant parameters are | |
| --- | --- |
| Responsivity (A/W), R = | 0.945 |
| Transconductance gm = | 28ms |
| Total leakage current of FET and photodiode It = | 200nA |
| Temperature = | 300K |
| Channel noise coefficient = | 4 |
| Break frequency of 1/f noise F = | 100 MHz |
| Bandwidth factor d = | 0.6 |
| Open loop gain of pre-amplifier Av = | 37 |
| Stray capacitance of feedback resistor Cf = | 0.01pF |
| Total input capacitance Ct | 0.6pF |

Figure 9A:
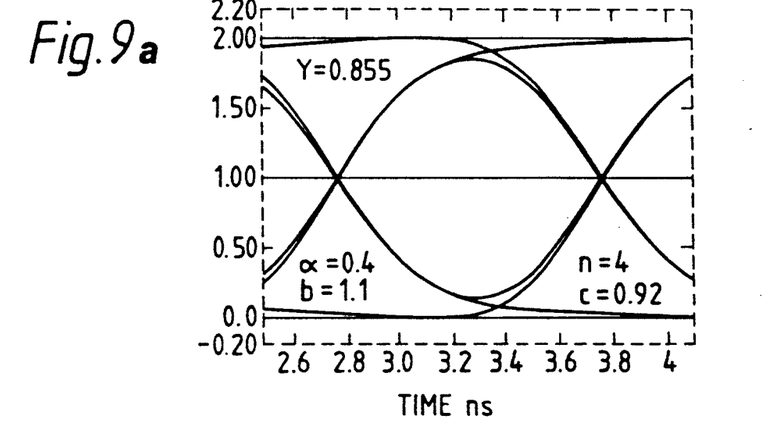
FIGS. 9a-9c show the eye diagrams for three embodiments of the invention, taking into account variations in component tolerances.
Figure 9B:
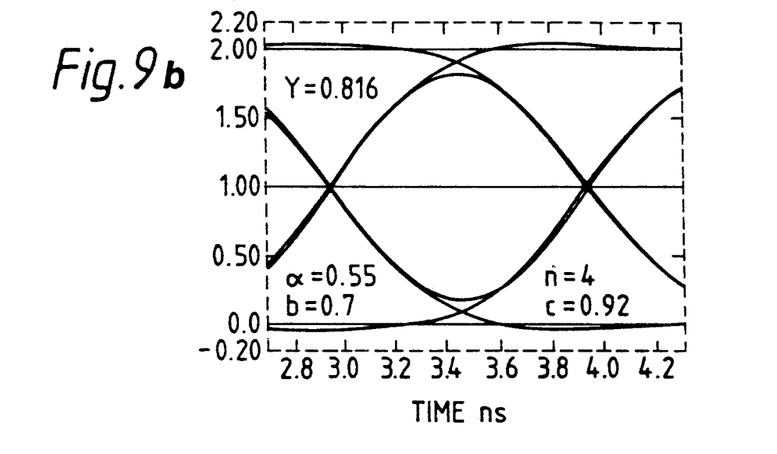
Figure 9C:
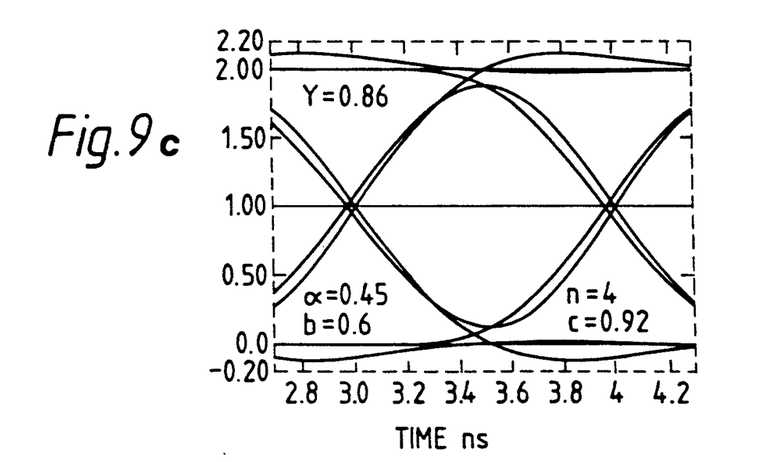

The penalty P2 represents the effect of the component value changes if raised cosine noise integral values are retained. The untoleranced case, $\alpha=0.45$ and $\beta=0.8$, is included first for comparison. CL is fixed at 0.65 pF. The eye diagrams (for the three combinations of damping factor and bandwidth factor set out in the following table) are shown in FIGS. 9a–9c.

| Rf kohm | RL kohm | gm mS | Ct | $\alpha$ | b | Y | 12 | 13 | 13f | P1 dB | P2 dB |
| --- | --- | --- | --- | --- | --- | --- | --- | --- | --- | --- | --- |
| 19.1 | 1.2 | 30 | 0.6 | 0.45 | 0.8 | 0.9 | 1.27 | 0.19 | 0.4 | 0.38 | 0.13 |
| 15.3 | 1.1 | 36 | 0.47 | 0.4 | 1.1 | 0.85 | 1.43 | 0.28 | 0.5 | 0.4 | 0.26 |
| 15.3 | 0.96 | 24 | 0.72 | 0.55 | 0.7 | 0.82 | 1.38 | 0.17 | 0.39 | 1.24 | 1.09 |
| 22.9 | 1.44 | 24 | 0.72 | 0.48 | 0.6 | 0.86 | 1.32 | 0.15 | 0.37 | 0.83 | 0.83 |

It can be seen that the performance obtained using the second order pre-amplifier approach is quite tolerant to component variations. The larger penalties of the last two data sets being dominated by the ±20°/o tolerance on component values rather than the noise integrals. The jitter is well under control for all but the last case.

The tractability of setting up a receiver for multi-bit rate operation needs further consideration. The component CL has been assumed fixed, at some design value, for the above discussion. With the freedom to control CL using a varactor diode, and the use of a FET configured as a variable resistance in the transimpedance feedback; the means exist to tailor the response as desired. However, the manual setting up of a receiver by inspection of frequency or time domain performance would not be easy or quick. If this approach were to be adopted then an automated test bed should be established.

Since eye opening and jitter have been constrained within reasonable bounds in all the options considered above it is useful to frame a summary of our findings in terms of receiver performance penalties at 400 Mbit/s (relative to raised cosine) and bandwidth/power requirements on the subsystem.

The table below summarises the options considered.

| Option | Filter | Pre-amp Order/ bandwidth | Multi-Stage Post-amp bandwidth | Penalty (dB) | 3 stage power (mW) 500Mbit/s |
| --- | --- | --- | --- | --- | --- |
| 1a | Y | 1 0.6 | | 0.2 | |
| 1b | Y | 1 0.6 | 0.7 | 0.2 | 27 |
| 2 | N | 1 1.56 | 0.7 | 2.35 | 27 |
| 3 | N | 1 0.7 | 0.9 | 1.8 | 108 |
| 4a | N | 2 0.7 | 0.9 | 0.17 | 108 |

-continued

| Option | Filter | Pre-amp Order/ bandwidth | Multi-Stage Post-amp bandwidth | Penalty (dB) | 3 stage power (mW) 500Mbit/s |
| --- | --- | --- | --- | --- | --- |
| b4 | N | 2 0.8 | 0.4 | 0.47 | <14 |

Options 1a and 1b = Butterworth plus single pole pre-amp.
Option 2 = Cascade of equal single pole responses.
Option 3 = Cascade of single poles where the pre-amplifier pole is less than the remaining equal poles.
Options 4a and 4b = Second order response from the pre-amp.

Options 1b and 4b are the most favourable: the reduction of the required post-amplification bandwidth pays rapid dividends in lowering the power consumption.

The traditional approach to equalisation for low noise fiber optic subsystem design is to use a separate filter block which is intended to provide an approximate raised cosine spectrum at the decision circuit. It is usually assumed that the pre-amplifier will be designed to provide a monotonic amplitude frequency response with a single order roll off characteristic and a bandwidth of 0.6 to 0.7 of the bit rate. When the receiver is a separate product this approach is aesthetically acceptable although it is difficult to define receiver performance when the provision of adequate filtering is left to the user.

If a simple, separate, Butterworth filter is used with a single order pre-amplifier, then all gain blocks must have wide bandwidth. We have shown above that a modified Butterworth is well worth considering to reduce the power consumed by the subsystem. If the response of a cascade of gain blocks with limited bandwidth is used without a separate filter, then there will be a significant receiver penalty, without a significant return in reduced power consumption.

For solutions using a higher level of integration, there is an opportunity to design the spectral characteristics of the pre-amplifier and subsystem as a whole with the aim of minimising component count and power consumption whilst maintaining product flexibility. A maximally flat receiver response with a steep roll off could be aesthetically acceptable for a separate receiver product but attention must be paid to specifying the phase characteristics and bandwidth of the subsystem to be provided by the user.

In the circuits illustrated, the transistors are field effect transistors, but the circuits could be produced using bipolar transistors.

Because a receiver of the invention does not incorporate a dedicated passive filter, it is particularly suitable for fabrication as an integrated circuit and it would be possible to form the receiver on a single chip if required. However, the approach to receiver design described herein is also applicable to circuits not fabricated as integrated circuits.

In the embodiments illustrated, the load determining the open-loop pole is a capacitor connected to the stage output. If required, for example, to enable variation of the open-loop bandwith, this capacitor could be implemented as a voltage controlled capacitor (Varactor).

It would also be possible to implement the load in other ways, for example, by using a series inductance driving a load resistor.

Although the embodiments of the present invention described above have a linear phase response, in another context it may be more important that a receiver shows a maximally flat gain response than a linear phase response. In such a case, a different relationship between the parameters of the feedback means and of the load, for example, the capacitor, may be chosen. For a maximally flat response, the complex pole interaction would require a rather lower damping factor, typically, 0.7, rather than 0.8 as in the linear phase embodiment particularly described above. However, it is still possible to obtain a relatively good phase response, though not necessarily quite linear.

I claim:

1. A transimpedance high bit rate pre-amplifier circuit fabricated as an integrated circuit having a predetermined complex pole pair, small signal response comprising:

a first amplifier stage having a transistor and an input and an output, feedback means determining a closed-loop pole in the circuit response, the feedback means coupling the output to the input, and a load determining an open-loop pole in the circuit response, the load including a reactive element connected to the output of said first stage to determine said open-loop pole, wherein the open-loop pole associated with the load and the closed-loop pole associated with the feedback means interact such that the pre-amplifier circuit has said predetermined complex pole pair small signal response.

2. A circuit as in claim 1, wherein said load comprises a capacitor having one terminal connected to said stage output and its other terminal connected to a supply rail.

3. A circuit as in claim 2, wherein said capacitor is a voltage controlled capacitor whose other terminal is connected to a controlling power supply rail.

4. A circuit as in claim 1, wherein said feedback means comprises a resistive element.

5. A circuit as in claim 1, further comprising one or more level shifting diodes serially connected and constantly forward biased in the feedback means.

6. A circuit as in claim 1, further comprising an additional transistor connected in cascode to the transistor of said first transistor amplifier stage.

7. A circuit as in claim 1, further comprising one or more further amplifying stages connected in cascade with said first amplifier stage and wherein said feedback means is not connected between the output and input of the first amplifier stage but, instead is connected between an output of one of said further stages and the input of said first stage.

8. A circuit as in claim 7, wherein the or each said further stage is an inverting differential amplifier.

9. A circuit as in claim 1, wherein the transistor amplifier stage is made of one or more field effect transistors.

10. A circuit as in claim 1, fabricated as an integrated circuit on a gallium arsenide chip.

11. A receiver circuit comprising a transimpedance pre-amplifier circuit as in claim 1, and at least one post-amplifier connected to receive the output of said pre-amplifier circuit.

12. An integrated circuit transimpedance pre-amplifier suitable for use in the signal path from the detector means of a high bit rate optical signal receiver to the pre-decision point amplification of the receiver, the transimpedance pre-amplifier comprising:

an input, an optical-to-electrical converter coupled to said input, a reactive impedance load, an output connected to said reactive impedance load, amplifier means connected to amplify signals applied to the input and supply such amplified signals to the output, and feedback means connecting said output back to said input and causing with said load a complex pole interaction in the response of the transimpedance pre-amplifier which enables the small signal bandwidth of subsequent cascaded gain stages to be reduced compared to that which would be required for similar receiver performance in the absence of said complex pole interaction.

13. An integrated circuit transimpedance pre-amplifier suitable for use in the signal path from an optical signal receiver detector to the pre-decision point amplification of the receiver, the transimpedance pre-amplifier comprising:

an input, an output-to-electrical converter coupled to said input, a reactive impedance load, an output connected to said reactive impedance load, and amplifier means connected to amplify signals applied to the input and supply such amplified signals to the output, and feedback means connecting said output back to said input, wherein the loop bandwidth of the transimpedance pre-amplifier is tailored with regard to the small signal frequency response of subsequently cascaded gain stages which will be in the receiver signal path between the pre-amplifier's output and the receiver's decision point, by a complex pole interaction, determined at least in part by the combination of the feedback means and the reactive load, in the transimpedance pre-amplifier response thereby enabling the bandwidth of said gain stages to be reduced compared to that which would be required for similar performance in the absence of said complex pole interaction.

14. An integrated circuit transimpedance pre-amplifier suitable for use in an optical receiver for a high bit rate digital communications system, the pre-amplifier having:

an optical-to-electrical signal detector, an input to receive an output from said optical-to-electrical signal detector of the receiver, a reactive impedance load, an output connected to said reactive impedance load and to the input of a subsequent amplification stage on the receiver, and amplifier means connected to amplify signals applied to the input and supplying such amplified signals to the output, and feedback means connected between said input and output, wherein the open-loop bandwidth of the pre-amplifier is tailored with regard to the small signal frequency response of all said subsequent amplification stages of the receiver to ensure that the bandwidth of all the amplification stages between said detector and the receiver decision point exceeds the Nyquist rate for the system, said amplification stages also exhibiting substantially linear phase response, a complex pole interaction, determined at least in part by the combination of the feedback means and the reactive impedance load in the transimpedance pre-amplifier response enabling the bandwidth of said subsequent amplification stages to be reduced compared to that which would be required for similar performance in the absence of said complex pole interaction.

15. An optical receiver for a high bit rate digital communications system, the receiver comprising:
   an optical-to-electrical signal detector for producing high bit rate digital electrical signals,
   an integrated circuit amplifier chain comprising a transimpedance pre-amplifier having an input connected to said detector and at least one subsequent amplifier stage between the pre-amplifier and the receiver decision point, and
   feedback means connecting a predetermined amplifier output to the input of the transimpedance pre-amplifier located upstream in said amplifier chain,
   the open loop bandwidth of the pre-amplifier including a reactive load and being tailored with regard to the small signal frequency response of subsequent receiver gain stages to ensure that the bandwidth of all the amplification stages between the detector and the receiver decision point exceeds the Nyquist rate for the system, said amplification stages also exhibiting a linear or near linear phase response,
   a complex pole interaction in the transimpedance pre-amplifier response determined at least in part by the combination of the feedback means and a reactive load enabling the bandwidth of said subsequent amplification stages to be reduced compared to that which would be required in the absence of said complex pole interaction.

16. A high bit rate optical signal receiver circuit comprising:
   an optical-to-electrical signal transducer,
   an integrated circuit pre-amplifier circuit having at least one transducer stage and a circuit input connected to said transducer,
   feedback means coupled to said circuit input,
   said pre-amplifier circuit also having a circuit output coupled to said feedback means, and
   at least one post-amplifier stage having its input connected to said pre-amplifier circuit output,
   wherein the pre-amplifier circuit is arranged to have a complex pole pair small signal response, and there is no dedicated passive LC filter in the receiver circuit.

17. A receiver circuit as in claim 16,
   wherein the transistor amplifier stage has a load including a reactive element arranged to determine the open-loop pole of the stage, and
   wherein the relationship between the parameters of the feedback means and of the load is chosen such that the open-loop pole interacts with the closed-loop pole associated with said feedback means to provide the complex pole pair small signal response of the pre-amplifier circuit.

18. A receiver circuit as in claim 16 arranged to receive and amplify digital signals having a bit rate B, wherein said pre-amplifier circuit is arranged to have a bandwidth in the range of 0.6 to $0.7 \times B$, and the post amplifier or amplifiers a bandwidth in the range of 0.6 to $0.7 \times B$.

19. A receiver circuit as in claim 16, wherein said pre-amplifier circuit comprises:
   a first transistor amplifier stage having an input and an output, and
   a load including a reactive element connected to the output of said first stage to determine the open-loop pole of the circuit,
   wherein the feedback means and the load cause the open-loop pole associated with the load and the closed-loop pole associated with the feedback means to interact such that the pre-amplifier circuit has a predetermined complex pole pair small signal response.

* * * * *